(12) United States Patent
Lee et al.

(10) Patent No.: US 7,692,770 B2
(45) Date of Patent: Apr. 6, 2010

(54) PROXIMITY TYPE EXPOSURE APPARATUS

(75) Inventors: Cheon-Soo Lee, Chungcheongbuk-Do (KR); Sang-Whan Cha, Gyeonggi-Do (KR); Hyun-Jang Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1021 days.

(21) Appl. No.: 11/319,387

(22) Filed: Dec. 29, 2005

(65) Prior Publication Data
US 2006/0209288 A1 Sep. 21, 2006

(30) Foreign Application Priority Data
Mar. 18, 2005 (KR) ...................... 10-2005-0022863

(51) Int. Cl.
G03B 27/62 (2006.01)
G03B 27/42 (2006.01)
(52) U.S. Cl. .......................................... 355/75; 355/53
(58) Field of Classification Search .................... 355/53, 355/72, 75; 356/399, 400, 401; 378/34
See application file for complete search history.

(56) References Cited

U.S. PATENT DOCUMENTS 4,514,858 A * 4/1985 Novak .......................... 378/34
4,525,852 A * 6/1985 Rosenberg .................... 378/34
4,544,311 A   10/1985 Husain
4,948,330 A    8/1990 Nomura et al.
6,141,108 A   10/2000 Kida et al.

FOREIGN PATENT DOCUMENTS

JP    2004-153094    5/2004

OTHER PUBLICATIONS

Engllish Translation of Chinese Office Action (dated Dec. 2008).*
English Translation of Japanese Patent document JP 2004-153094 (dated May 27, 2004).*

* cited by examiner

Primary Examiner—Alan A Mathews
(74) Attorney, Agent, or Firm—Birch, Stewart, Kolasch, & Birch LLP

(57) ABSTRACT

An apparatus and method for aligning a substrate and a mask are discussed. In one aspect of the present invention, the apparatus includes a mask stage, wherein the mask stage includes a mask fixing stage configured to fixedly support a mask; a base stage supporting the mask fixing stage; and at least one guide unit disposed in the base stage, coupled to the mask fixing stage, and configured to move the mask fixing stage, so as to move the mask in a predetermined direction.

17 Claims, 4 Drawing Sheets

PROXIMITY TYPE EXPOSURE APPARATUS

The present application claims, under 35 U.S.C. §119, the priority benefit of Korean Patent Application No. 10-2005-0022863 filed Mar. 18, 2005 in Korea, the entire contents of which are herein fully incorporated by reference.

BACKGROUND OF THE INVENTION

1. Field of the Invention

The present invention relates to a proximity type exposure apparatus, and particularly, to a proximity type exposure apparatus provided with a load support unit supporting a mask stage and a guide unit driving the mask stage and to a method of aligning a mask to a substrate using the proximity type exposure apparatus.

2. Description of the Related Art

A process of forming a plurality of thin films is required in a manufacturing process of a semiconductor device or a liquid crystal display (LCD) device, and the thin film forming process is performed by a common exposure technology. Here, the exposure technology is that ultraviolet rays or X-rays are radiated through a mask having a predetermined pattern to expose a photosensitive material applied on a substrate and therefore, the predetermined pattern is transferred onto the substrate.

As for the LCD device, the exposure technology is used in many processes such as patterning of a gate line, a data line and a unit pixel of the LCD device and forming of a color filter layer of a color filter substrate. For this reason, the technology is considered to be important since transferring of a precise pattern on the substrate is needed.

In general, an exposure apparatus can be categorized into a projection type exposure apparatus allowing a reduced and magnified pattern transfer and a proximity type exposure apparatus allowing pattern transfer at a 1:1 ratio by using horizontal and parallel rays of light.

The projection type exposure apparatus that allows exposure with a reduced pattern can be commonly used to fabricate a device that requires integration such as a semiconductor device. When the same size pattern needs to be formed on a large area, for example, for an LCD device, the proximity type exposure apparatus using a large mask is suitable.

The proximity type exposure apparatus needs to perform exposure on a substrate, approaching the substrate as close as possible in order to transfer a mask pattern onto the substrate completely. There is a contact type exposure apparatus that performs exposure in a state that a mask is in complete contact with the substrate. However, such an exposure apparatus may cause damage to the mask by a foreign substance on the substrate or the contact itself between the mask and the substrate. Therefore, the proximity type exposure apparatus is directed to making a mask stage close to the substrate without any contact therebetween.

Each of the proximity type and projection type exposure apparatuses basically includes an illumination optical system generating light for exposure, a mask stage supporting a mask having a predetermined pattern, a substrate support chuck on which a substrate onto which the pattern of the mask is transferred is mounted, and supporters equipped with the substrate support chuck.

Also, because it is important for the exposure apparatus to precisely transfer a pattern of a mask onto a substrate, a plurality of alignment cameras for checking locations of the mask stage and the substrate are provided for the purpose of aligning the mask stage and the substrate. The alignment camera recognizes an alignment key that may be formed on the substrate support chuck or the substrate, thereby aligning the substrate and the mask stage.

As an LCD device gets larger, a mask becomes larger and a mask stage that supports the mask also becomes larger. The mask is installed under the mask stage so that the mask can approach the substrate as close as possible, and the mask is fixed to the mask stage by a fixing member.

The proximity type exposure apparatus having the aforementioned elements according to a related art will now be described with reference to FIG. 1.

Referring to FIG. 1, the proximity type exposure apparatus includes an illumination optical system 101 providing light, a mask stage 105 installed under the illumination optical system 101 and supporting a mask 110, supporters 120 supporting four corners of the mask stage 105, an x-axis driving plate 113 and a y-axis driving plate 112 formed under the mask stage 105 and supporting a substrate 114, a chuck 111 supporting the x-axis driving plate 113 and the y-axis driving plate 112, and a base plate 150 constituting a base of the exposure device.

The illumination optical system 101 serves to transfer a mask pattern onto the substrate 114 by generating light such as ultraviolet rays or x-rays.

The mask stage 105 includes an upper plate 103 directly coupled with the mask 110 and a lower plate 102 supporting the upper plate 103 of the mask stage and constituting a base of the mask plate.

The mask stage 105 supports the mask 110 such that the upper plate 103 on which the mask is directly arranged is coupled under the lower plate 102 to allow the mask 110 to approach the substrate 114 as close as possible. Also, the lower plate 102 and the upper plate 103 of the mask stage are vacant in the middle so as to allow light proceeding from the illumination optical system 101 to pass through the mask 110 and be emitted to the substrate 114.

Also, four corners of the mask stage 105 are supported by the bar-shaped mask stage supporters 120.

Under the mask stage 105 the substrate 114 is arranged and the x-axis driving plate 113 and the y-axis driving plate 112 for moving the substrate 114 are installed.

The y-axis driving plate 112 is installed on the support chuck 111. A predetermined rail is installed in the y-axis direction on the support chuck 111, and the y-axis driving plate 112 is coupled to the rail, so that the substrate can be moved in the y-axis direction. Also, a predetermined rail is also installed on the y-axis driving plate 112 and the x-axis plate 113 is coupled to the rail, so that the substrate can be moved in the x-axis direction.

The substrate 114 is mounted on the x-axis plate 113 and is moved to a certain coordinate by the operation of the x-axis driving plate 113 and the y-axis driving plate 112. Because the substrate 114 is greater than the mask in general, a plurality of exposure processes are performed while the substrate 114 moves. In such a manner, a mask pattern is transferred onto the entire substrate 114.

It is very important for the exposure apparatus to accurately align a mask stage and a substrate because the apparatus is directed to transferring a fine mask pattern onto a substrate. Therefore, in order to precisely align the mask stage and the substrate, an alignment camera (not shown) for the alignment between the substrate and the mask stage is installed on the mask stage, and an alignment key is installed on the substrate or the x-axis driving plate.

The alignment camera precisely aligns the substrate and the mask stage by checking the alignment key.

However, because the x-axis driving plate 113 and the y-axis driving plate 112 are used to move the substrate to align the substrate and the mask stage, a limitation exists in that the mask and the substrate are not or cannot easily be aligned with precision, which is a problem since the mask and the substrate should be aligned by the unit of micrometer or smaller.

BRIEF DESCRIPTION OF THE INVENTION

Therefore, an object of the present invention is to provide a mask aligning device for precisely aligning a mask and a substrate in a proximity type exposure apparatus.

It is another object to provide a mask aligning device that does not cause a defective adjustment due to a load in an exposure apparatus provided with a large mask stage, by installing the mask aligning device so as not to be affected by a load of the mask stage.

It is another object of the present invention to provide a mask aligning device and method, which overcome the limitations and disadvantages associated with the related art.

To achieve these and other advantages and in accordance with the purpose of the present invention, as embodied and broadly described herein, there is provided according to an aspect of the present invention, an exposure apparatus comprising: a mask stage including a mask fixing stage to which a mask is fixed and a base stage supporting the mask fixing stage; load support units dispersing a load of the mask fixing stage to the base stage; guide units serving precise driving of the mask fixing stage; supporters supporting the mask stage; a substrate onto which a pattern of the mask is transferred; and a driving plate moving the substrate.

According to one aspect of the present invention, the mask fixing stage can be installed in the middle of the base stage and is connected to the base stage by the load support units. One side of each load support unit is coupled to the mask fixing plate by a coupling member and the other side thereof is connected to the base stage, wherein a sliding member is interposed between the load support unit and the base stage so as to allow the mask fixing plate to slightly move from the base stage.

According to one aspect of the present invention, the base stage guide units that can slightly move the mask fixing stage are installed at at least three of four sides of the mask fixing stage to thereby slightly move the mask fixing stage in the a-axis, y-axis and θ-axis directions.

Therefore, in the exposure apparatus in accordance with the present invention, even if the mask fixing stage is large and heavy, the guide units can precisely move the mask fixing stage because the load support units withstand the weight of the mask fixing stage. Accordingly, the precise alignment of the mask can be achieved in the exposure apparatus that requires precise alignment between the substrate and the mask.

According to one aspect of the present invention, there is provided an exposure apparatus comprising a mask stage including a mask fixing stage to which a mask is fixed and a base stage supporting the mask fixing stage, at least one load support unit dispersing a load of the mask fixing stage to the base stage, at least one guide unit configured to move the mask fixing stage, at least one supporter supporting the mask stage, and at least one driving plate configured to move a substrate onto which a pattern of the mask is to be transferred.

According to one aspect of the present invention, there is provided an exposure apparatus comprising a mask stage including a mask fixing stage configured to fixedly support a mask, a base stage supporting the mask fixing stage, and at least one guide unit disposed in the base stage, coupled to the mask fixing stage, and configured to move the mask fixing stage, so as to move the mask in a predetermined direction.

According to one aspect of the present invention, there is provided a method of aligning a substrate and a mask with respect to each other using an exposure apparatus, the exposure apparatus including a mask fixing stage configured to fixedly support the mask, at least one guide unit configured to move the mask fixing stage, and at least one substrate driving member configured to move the substrate, the method comprising coarsely moving the substrate by an operation of the at least one substrate driving member to coarsely align the substrate with the mask, and finely moving the mask fixing stage by an operation of the at least one guide unit to finely align the substrate with the mask.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A structure of a proximity type exposure apparatus in accordance with the present invention will now be described with reference to FIG. 2.

Figure 2:
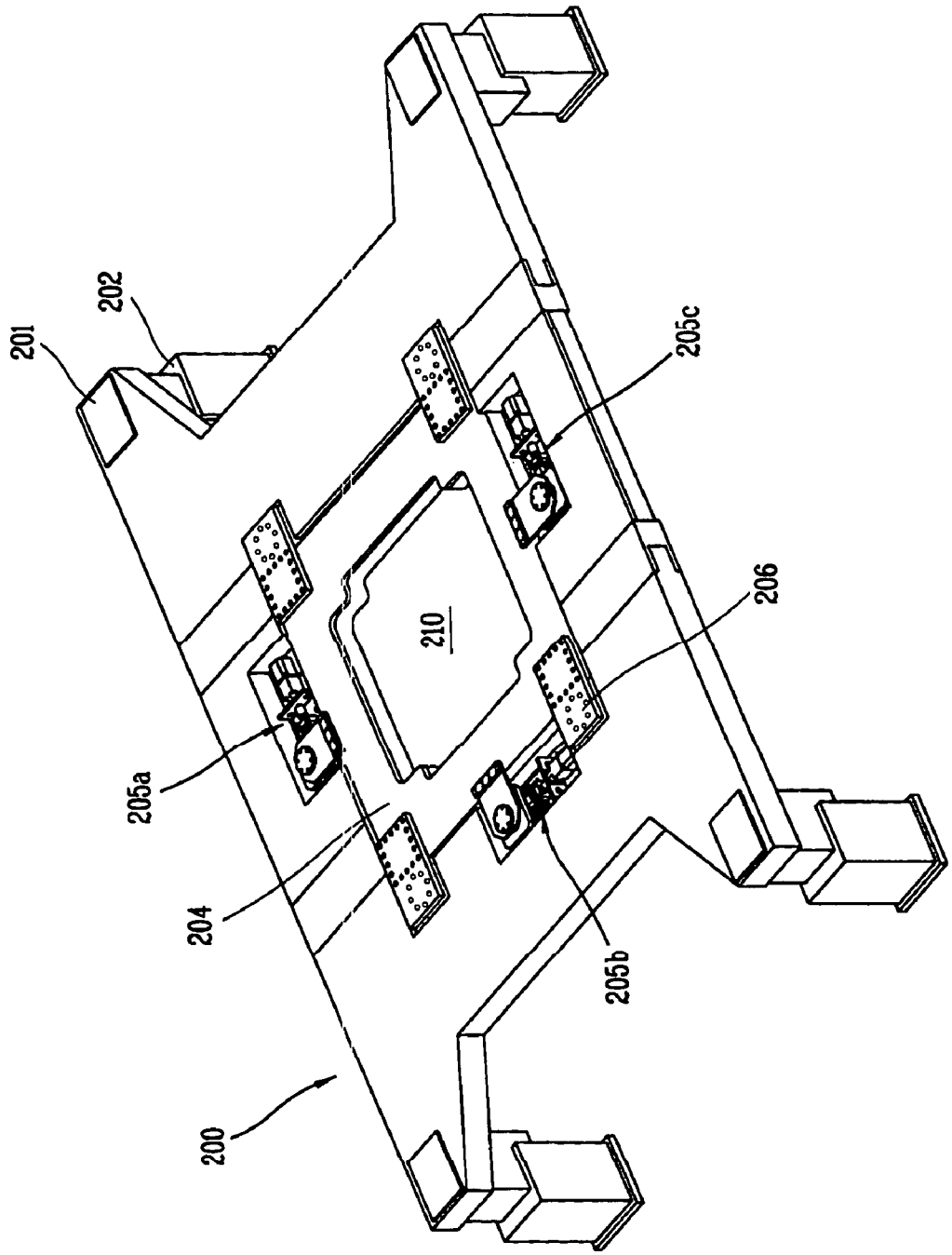
FIG. 2 is a perspective view of a mask stage of a proximity type exposure apparatus in accordance with an embodiment of the present invention.

FIG. 2 is a perspective view that illustrates a mask stage 200 and a supporter 202 supporting the stage 200 of the proximity type exposure apparatus in accordance with the present invention.

Referring to FIG. 2, the mask stage 200 in accordance with the present invention includes a rectangular base stage 201 constituting a base of the mask stage, a mask fixing stage 204 formed in the middle of the base stage 201, to which a mask 210 with a predetermined pattern is fixed, supporters 202 connected to edges of the base stage 201 to support the base stage 201, load support units 206 withstanding a load of the mask fixing stage 204 and connecting the mask fixing stage 204 with the base stage 201, and a plurality of guide units 205a, 205b and 205c moving the mask fixing stage 204 precisely.

The mask stage 200, the base stage 201 and the mask fixing stage 204 have a generally rectangular shape but can be in other shapes. Also, the supporter 202 for supporting the mask stage 200 is installed at four corners of the base stage 201.

The supporter 202 may be four columns respectively formed at the four corners of the base stage 201 and can extend in a longitudinal direction so as to control the height of the mask stage 200. The supporter 202 is connected to a base plate constituting a bottom of the exposure apparatus.

Figure 1:
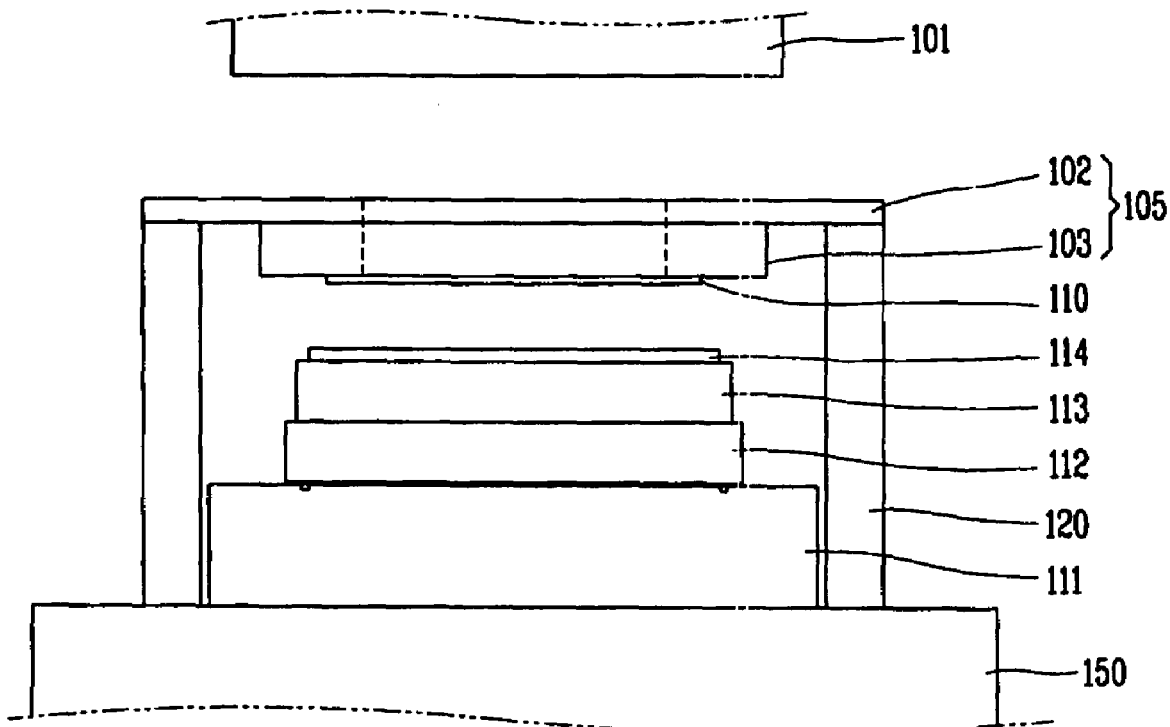
FIG. 1 is a front view of a general proximity type exposure apparatus.

The base stage 201 has a vacant space in its middle area for installation of the mask fixing stage 204, and the mask fixing stage 204 is installed at that vacant space. The mask fixing stage 204 installed at that vacant space also has a vacant space in its middle area. The mask 210 is installed at that vacant space of the mask fixing stage 204 and therefore receives light proceeding from an illumination optical system (e.g., 101 in FIG. 1). For the base stage 201 and the mask fixing stage 204, the vacant space can be formed in other locations, instead of the middle areas.

Because the exposure apparatus in accordance with an embodiment of the present invention is designed to be suitable for exposing a large LCD panel or the like, a mask should be large to expose the large LCD panel. Thusly, the mask fixing stage 204 fixing the mask also becomes large. If the large mask fixing stage 204 is formed of a metallic material, it has a very large weight which may be in unit of tons. Therefore, a member for withstanding the weight of the mask fixing stage 204 and connecting the mask fixing stage 204 with the base stage 201 is required, and a load support unit 206 is provided for this reason according to an embodiment of the present invention.

Figure 4:
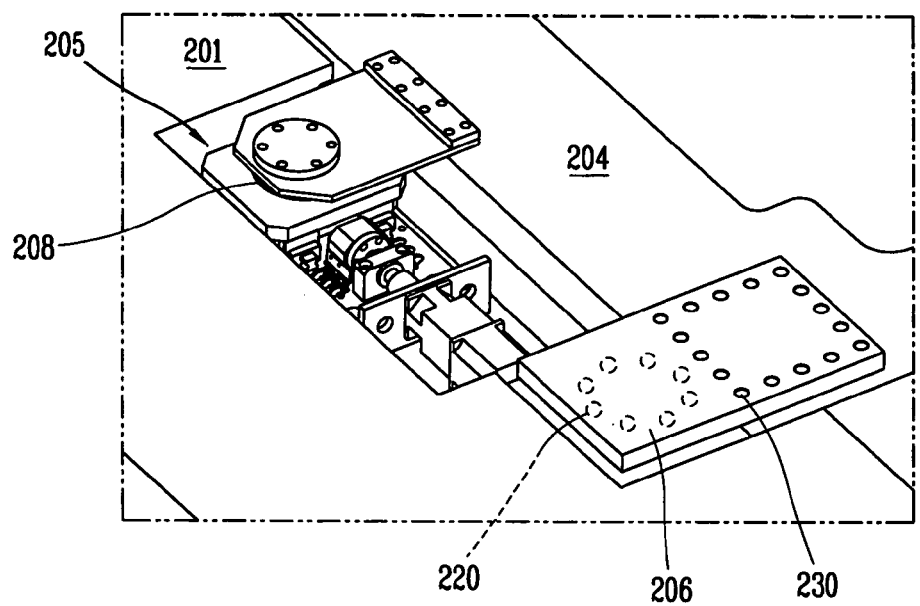
FIG. 4 is a perspective view that illustrates a guide unit and a load support unit in accordance with an embodiment of the present invention.

At least one load support unit 206 is formed at each of four sides of the mask fixing stage 204 and is coupled with the mask fixing stage 204 by any coupling member, e.g., a bolt 230 in FIG. 4. Also, the other end of the load support unit 206 is connected to the base stage 201 with ball bearing(s) interposed therebetween (i.e., between the base stage 201 and the load support unit 206), so that the load support unit 206 can slightly move on the base stage 201. Namely, the bearing support unit is in direct contact with the ball bearing(s) formed on the base stage 201 and can slightly move on the ball bearing(s). The construction of the load support unit 206 will be described later in more detail.

An important technical structure of the exposure apparatus is aligning the mask and the substrate for the exposure. As a result, for example, a plurality of alignment keys are provided on the substrate to be exposed or on a substrate driving plate in order to align the substrate and the mask fixed on the mask stage, and a detecting camera that can detect the alignment keys is provided on the mask stage. Also, because the mask stage is fixed to the base plate by the supporter, a substrate driving system for moving the substrate for the alignment between the mask and the substrate is required.

As a member for supporting and driving the substrate, the present invention provides substrate driving plates in addition to the guide units 205a-205c. These substrate driving plates are formed under the mask stage 200 and include an x-axis driving plate that can move the substrate in the x-axis direction and a y-axis driving plate that can move the substrate in the y-axis direction. These x-axis and y-axis driving plates can be the same as or similar to those of the related art, e.g., 112 and 113 in FIG. 1.

One of the x-axis driving plate and the y-axis driving plate is coupled with a rail formed on the base plate to move in the x-axis or y-axis direction.

Also, for example, if the x-axis driving plate is formed on the base plate, the y-axis driving plate is formed on the x-axis driving plate to move the substrate in the y-axis direction. Thusly, the substrate can move to a predetermined position by the operation of the x-axis driving plate and the y-axis driving plate. Because the substrate is larger than the mask in general, the substrate is moved to be entirely exposed.

Therefore, the present invention provides the guide units 205a-205c that can very precisely control a movement of a mask separately from the movement of the substrate (which is controlled by the substrate driving plates) when the mask and the substrate are aligned.

The guide unit serves to provide the precise alignment of a mask by controlling the movement of the mask fixing stage 204 directly coupled with the mask.

In order to align the mask and the substrate with precision, the mask should be moved in the x-axis, y-axis and θ-axis directions. In the present invention, at least three guide units 205a, 205b and 205c are provided at at least three of the four sides of the mask fixing stage 204 so as to move the mask 210 in the x-axis, y-axis and/or θ-axis directions.

The guide units 205a, 205b and 205c serve to move the mask fixing stage 204, and include an x-axis driving guide unit 205a, a y-axis driving guide unit 205b and a θ-axis driving guide unit 205c. The x-axis driving guide unit 205a moves the mask fixing stage 204 in the x-axis direction, the y-axis driving guide 205b moves the mask fixing stage 204 in the y-axis direction, and the θ-axis driving guide unit 205c allows the mask fixing stage 204 to rotate in the θ-axis direction, namely in the direction of rotation about the z-axis, by combining with the x-axis and y-axis driving guide units 205a and 205b.

Therefore, in aligning the mask and the substrate in the exposure apparatus in accordance with the present invention, the substrate and the mask are aligned coarsely by the x-axis and y-axis driving plates (substrate driving plates), and then, the mask fixing stage is precisely or finely moved further by using the guide units 205a-205c, thereby precisely aligning the mask and the substrate.

Here, the guide units 205a, 205b and 205c are spaced apart from the mask fixing stage 204 at a predetermined interval (gap) therebetween so as not to be affected by the load of the mask fixing stage 204. This is because, if the guide units 205a-205c are installed right under the mask fixing stage 204, the guide units 205a-205c can be greatly affected by the large load of the mask fixing stage 204 and consequently, it can become difficult to control the mask fixing stage 204 precisely. A connection member such a leaf spring is installed at the gap to connect the mask fixing stage 204 with the corresponding guide unit.

Therefore, the exposure apparatus in accordance with the present invention withstands the load of the mask fixing stage 204 by the load support units 206 and thusly supports the mask fixing stage 204. Also, each load support unit 206 is connected with the base stage 201 by a ball bearing or other connectors so as to allow the free movement of the mask stage 200 within a predetermined range when the mask fixing stage 204 is slightly moved by the guide unit(s) 206.

A plane structure of the mask stage 200 according to an embodiment of the present invention will now be described in more detail with reference to FIG. 3.

Figure 3:
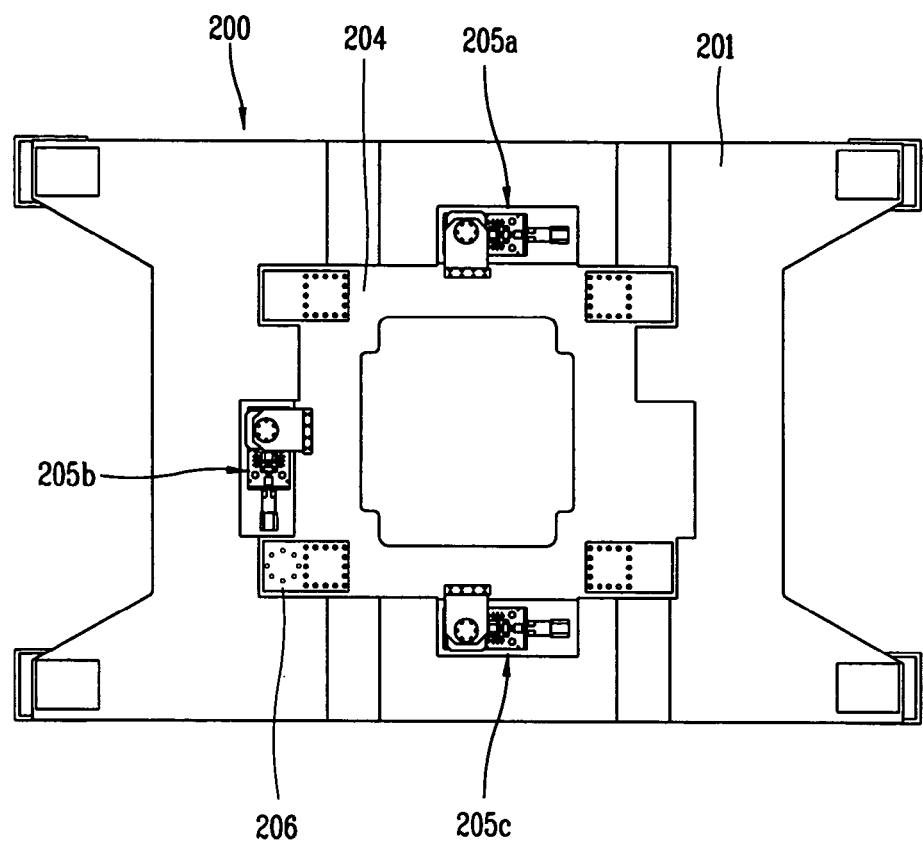
FIG. 3 is a plan view of the mask stage of FIG. 2 in accordance with the present invention.

Referring to FIG. 3, the mask stage 200 includes a rectangular mask stage 200 constituting a base of the mask stage, and a mask fixing stage 204 installed in the middle of the base stage 201 and having a rectangular shape.

The base stage 201 is vacant in the middle so that the mask fixing stage 204 can be installed thereto. The mask fixing stage 204 is installed at that vacant space. The mask stage 200, if used to expose a large LCD panel, can have a large size reaching, e.g., several meters widthwise and lengthwise and can be very heavy, and the mask fixing stage 204 also has a very large weight because it is made of a metallic material such as aluminum alloy.

In order to support the heavy mask fixing stage 204, the present invention specially provides one or more load support units 206 that withstand the mask fixing stage 204.

The load support units 206 may be respectively installed at four coroners or corner area of the rectangular mask fixing stage 204, connect the mask fixing stage 204 with the base stage 201 and disperse a load of the mask fixing stage 204 to the base stage 201. Other locations for the load support units 206 are possible.

One side of the load support unit(s) 206 is coupled with the mask fixing stage 204 by a fixing member such as a bolt or the like, and the other side thereof is connected to the base stage 201 with a ball bearing or the like interposed therebetween. Namely, because a plurality of ball bearings are installed at an upper end of the base stage 201 where the load support unit 206 and the base stage 201 are connected, the load support units 206 can move on the base stage 201 within a certain range, which consequently allows the mask fixing stage 204 (fixed to the load support units 206) to move on the mask stage 200 within a predetermined range.

One load support unit 206 may be formed at each of the four corners of the mask fixing stage 204, but any number of load support units 206 may be installed at each corner or other location of the mask fixing stage 204.

A plurality of guide units 205 are installed on the base stage 201 as a driving member that moves the rectangular mask fixing stage 204. In order to install each of the guide units 205, a portion of an upper side of the base stage 201 is cut and forms a recess. Namely, each of the guide units 205 is installed in the corresponding recess portion of the base stage 201 so that an upper surface of the guide unit may be on the same plane/level with an upper surface of the mask fixing stage 204.

At least three guide units 205 may be respectively installed at three sides or locations of the rectangular mask fixing stage 204 and allow the mask fixing stage 204 to move with precision in the x-axis, y-axis and θ-axis directions, respectively. Namely, the x-axis guide unit 205a is operated to move the mask fixing stage 204 in the x-axis direction within a predetermined range, the y-axis guide unit 205b is operated to move the mask fixing stage 204 in the y-axis direction, and the x-axis, y-axis and θ-axis guide units 205a-205c are simultaneously operated to move the mask fixing stage 204 in the θ-axis direction. A power transfer unit of the guide unit 205 is connected to the mask fixing stage 204 by a connection member such as a leaf spring.

The mask fixing stage 204 is vacant in the middle. A mask such as 210 in FIG. 2 having a predetermined pattern is installed at that vacant space, and a pattern of the mask is transferred onto the substrate below by light proceeding from the illumination optical system.

The structures of the guide units 205 and the load support units 206 in accordance with an embodiment of the present invention will now be described in more detail with reference to FIG. 4.

FIG. 4 is a view that illustrates the guide unit 205 and the load support unit 206 installed on the mask stage 200 in accordance with the present invention.

The load support units 206 are installed at the four corners of the mask fixing stage 204, and the guide units 205 moving the mask fixing stage 204 are formed on the base stage 201 corresponding to at least three of the four sides of the mask fixing stage 204.

As shown in FIG. 4, each load support unit 206 is coupled with the mask fixing stage 204 by a coupling member such as a bolt 230, and is connected onto the base stage 201 by a sliding member of the mask fixing stage 204 such as a ball bearing 220.

Each guide unit 205 transfers power linearly by, e.g., a piston movement, and allows the mask fixing stage 204 to move in the x-axis, y-axis and/or θ-axis directions.

A head portion of each guide unit 205 constitutes a power transfer unit transferring power to the mask fixing stage 204, and an upper surface of the power transfer unit connects the guide unit 205 and the mask fixing stage 204 to each other by a connection member 208 such as a leaf spring. One reason for using the leaf spring as the connection member 208 is because it can transfer power of the guide unit 205 properly even when the mask fixing stage 204 is moving. Accordingly, to properly transfer the power of the guide unit 205, an upper end of the power transfer unit is preferably on the same level with an upper surface of the mask fixing stage 204.

The structure of the guide unit 205 according to an embodiment of the present invention will now be described in more detail with reference to FIG. 5.

Figure 5:
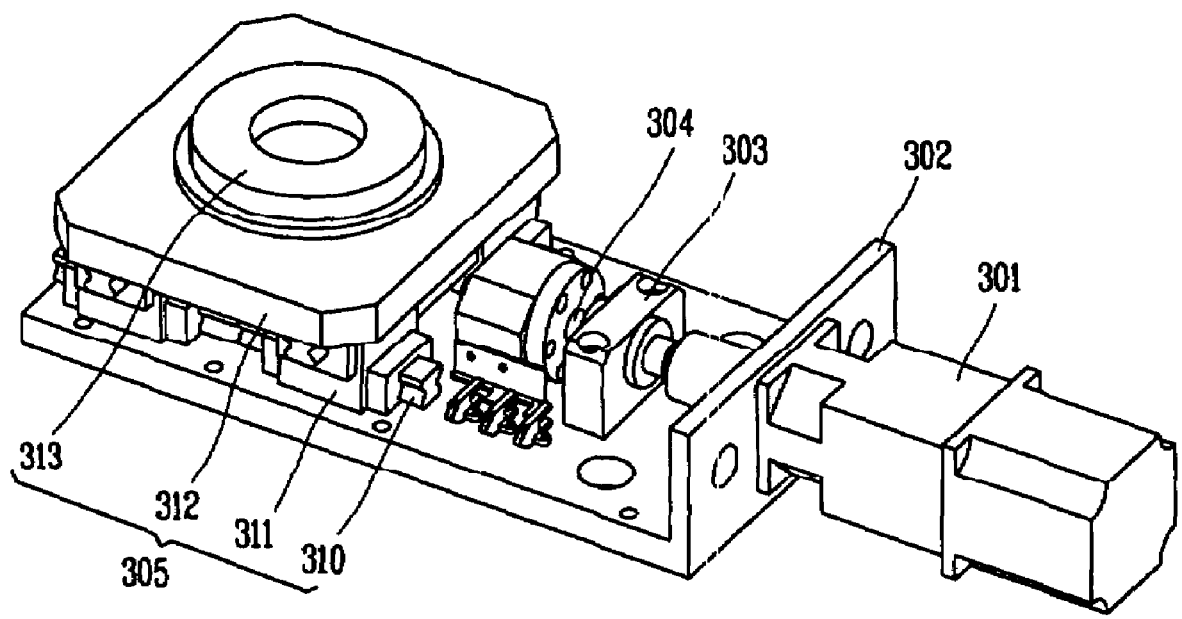
FIG. 5 is a perspective view that illustrates the guide unit of FIG. 4 in accordance with the present invention.

Referring to FIG. 5, each guide unit 205 in accordance with the present invention includes a power generating unit 301 generating power such as a motor, a power generating unit supporter 302 supporting the power generating unit 301, a ball screw unit 304 transferring the power of the power generating unit 301, a ball screw supporter 303 supporting the ball screw, and a power transfer unit 305 transferring power to the mask fixing stage 204. The ball screw unit 304 can include a shaft receiving the power.

The power transfer unit 305 includes a guide rail portion 310 providing a path of a horizontal movement of the power transfer unit, a sliding portion 311 moving on the guide rail portion 310 to move the power transfer unit 305, a power transfer unit upper plate 312 installed on the sliding portion 311, and a connection member fixing member 313 fixing the connection member 208 that connects the mask fixing stage 204 with the power transfer unit 305 in the power transfer unit upper plate 312.

Thusly, the power generated from the power generating unit 301 is moved back and forth by the ball screen to move the power transfer unit 305 and thusly move the mask fixing stage 204 connected to the power transfer unit 305 by the connection member.

The guide units 205 are formed at at least three of the four sides of the rectangular mask fixing stage 204 and move the mask fixing stage 204 in the x-axis and y-axis directions. Also, the mask fixing stage 204 may be rotated as the operations of the three guide units are combined.

Also, an x-axis driving stage (plate) and a y-axis driving stage (plate) for moving the substrate to be patterned in x-axis and y-axis are provided under the mask stage in accordance with the present invention. By the driving stages, the substrate can move to a predetermined position, and the entire substrate is exposed by light irradiated through the mask stage.

In the exposure apparatus in accordance with the present invention, a substrate is primarily or coarsely aligned by a movement of a substrate driving stage that moves the substrate, and then a mask fixing stage is controlled and moved minutely or finely by the guide units. As a result, a precise alignment between the mask stage and the substrate is made.

Accordingly, the substrate and the mask stage can be precisely aligned in the exposure process that requires high precision. Also, the load support units that support the mask stage having a large weight are provided to allow the precise movement of the guide units. Accordingly, the alignment between the mask and the substrate can be controlled, more precisely in an effective manner.

As described so far, the exposure apparatus in accordance with the present invention is provided with the guide unit(s) that can drive the mask stage, and the load support unit(s) that withstand the weight of the mask stage. Thusly, the mask stage can be precisely aligned and therefore, the mask and the substrate can be aligned with respect to each other precisely.

Also, because both the substrate driving plate and the guide units driving the mask stage are provided, accurate alignment between the mask stage and the substrate is possible without delay.

The exposure apparatus can be applied to any substrate or layer that needs to be exposed through a mask for patterning or other purposes. For instance, the substrate can be a layer in a display device such as an LCD device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An exposure apparatus comprising:
   a mask stage including a mask fixing stage to which a mask is fixed and a base stage supporting the mask fixing stage;
   at least one load support unit dispersing a load of the mask fixing stage to the base stage;
   at least one guide unit configured to move the mask fixing stage, wherein the guide unit includes a first driving guide unit moving the mask fixing stage in a x-axis direction, a second driving guide unit moving the mask fixing stage in a y-axis direction and a third driving guide unit moving the mask fixing stage in a θ-axis direction by combining with the first driving guide unit and the second driving guide unit;
   at least one supporter supporting the mask stage; and
   at least one driving plate configured to move a substrate onto which a pattern of the mask is to be transferred.

2. The exposure apparatus of claim 1, wherein the mask fixing stage is installed in a middle area of the base stage and is connected to the base stage by the at least one load support unit.

3. The exposure apparatus of claim 2, wherein one side of each load support unit is coupled to the mask fixing stage by a coupling member and another side of each load support unit is connected to the base stage, and
   wherein the exposure apparatus further comprises a sliding member interposed between each load support unit and the base stage so as to allow the mask fixing stage to slightly move from the base stage.

4. The exposure apparatus of claim 1, wherein the at least one load support unit involves a plurality of load support units installed at corners of the mask fixing stage.

5. The exposure apparatus of claim 1, wherein the at least one guide unit involves a plurality of guide units installed at least three sides of the mask fixing stage and slightly moves the mask fixing stage.

6. The exposure apparatus of claim 1, wherein power of the at least one guide unit is transferred to the mask fixing stage by a connection member.

7. The exposure apparatus of claim 6, wherein the connection member is a leaf spring.

8. The exposure apparatus of claim 1, wherein each of the at least one guide unit comprises:
   a power generating unit generating power
   a power transfer shaft transferring power of the power generating unit;
   a power transfer shaft supporter supporting the power transfer shaft;
   a power transfer unit transferring power of the power generating unit to the mask fixing stage; and
   a connection member connecting the power transfer unit and the mask fixing stage.

9. An exposure apparatus comprising:
   a mask stage including a mask fixing stage configured to fixedly support a mask; a base stage supporting the mask fixing stage; and
   at least one guide unit disposed in the base stage, coupled to the mask fixing stage, and configured to move the mask fixing stage, so as to move the mask in a predetermined direction,
   wherein the guide unit includes,
   a first driving guide unit moving the mask fixing stage in a x-axis direction, a second driving guide unit moving the mask fixing stage in a y-axis direction and a third driving guide unit moving the mask fixing stage in a θ-axis direction by combining with the first driving guide unit and the second driving guide unit, and
   wherein each of the at least one guide unit includes,
   a power generating unit to generate power;
   a supporter to support the power generating unit; and
   a power transfer unit to transfer the generated power to the mask fixing stage so as to move the mask fixing stage.

10. The apparatus of claim 9, wherein the plurality of guide units are disposed at at least three sides of the mask fixing stage.

11. The apparatus of claim 9, further comprising:
    at least one load support unit configured to disperse a load of the mask fixing stage to the base stage.

12. The apparatus of claim 11, wherein each of the at least one load support unit includes a first end portion fixedly connected to the mask fixing stage and a second end portion elastically connected to the base stage.

13. The apparatus of claim 9, further comprising:
    at least one substrate driving member configured to move a substrate intended to be exposed through the mask, so as to align the substrate and the mask with respect to each other.

14. The apparatus of claim 13, wherein the at least one substrate driving member moves the substrate coarsely, and the at least one guide unit moves the mask fixing stage finely.

15. The apparatus of claim 13, wherein the substrate is a layer in a liquid crystal display device.

16. A method of aligning a substrate and a mask with respect to each other using an exposure apparatus, the exposure apparatus including a mask fixing stage configured to fixedly support the mask, at least one guide unit configured to move the mask fixing stage, and at least one substrate driving member configured to move the substrate, the method comprising:
    coarsely moving the substrate by an operation of the at least one substrate driving member to coarsely align the substrate with the mask; and
    finely moving the mask fixing stage by an operation of the at least one guide unit to finely align the substrate with the mask, wherein the guide unit includes,
    a first driving guide unit moving the mask fixing stage in a x-axis direction, a second driving guide unit moving the mask fixing stage in a y-axis direction and a third driving guide unit moving the mask fixing stage in a θ-axis direction by combining with the first driving guide unit and the second driving guide unit.

17. The method of claim 16, wherein the finely moving step is performed after the coarsely moving step is performed.

* * * * *